(12) United States Patent
Chien et al.

(10) Patent No.: US 11,538,740 B2
(45) Date of Patent: Dec. 27, 2022

(54) LEADS FOR SEMICONDUCTOR PACKAGE

(71) Applicant: TEXAS INSTRUMENTS INCORPORATED, Dallas, TX (US)

(72) Inventors: Jason Chien, New Taipei (TW); Yuh-Harng Chien, New Taipei (TW); J K Ho, New Taipei (TW)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 145 days.

(21) Appl. No.: 16/511,313

(22) Filed: Jul. 15, 2019

(65) Prior Publication Data

US 2021/0020549 A1 Jan. 21, 2021

(51) Int. Cl.
*H01L 23/495* (2006.01)
*H01L 23/00* (2006.01)
*H01L 23/31* (2006.01)
*H01L 25/065* (2006.01)

(52) U.S. Cl.
CPC .... *H01L 23/49555* (2013.01); *H01L 23/3121* (2013.01); *H01L 23/49513* (2013.01); *H01L 23/49575* (2013.01); *H01L 24/32* (2013.01); *H01L 24/48* (2013.01); *H01L 24/73* (2013.01); *H01L 24/85* (2013.01); *H01L 25/0655* (2013.01); *H01L 24/49* (2013.01); *H01L 2224/32245* (2013.01); *H01L 2224/48091* (2013.01); *H01L 2224/48106* (2013.01); *H01L 2224/48137* (2013.01); *H01L 2224/48249* (2013.01); *H01L 2224/49171* (2013.01); *H01L 2224/49176* (2013.01); *H01L 2224/73265* (2013.01); *H01L 2224/85986* (2013.01)

(58) Field of Classification Search
CPC ......... H01L 23/49555; H01L 23/49513; H01L 24/48; H01L 24/85; H01L 25/0655; H01L 23/49551; H01L 23/49541; H01L 23/49544; H01L 23/49548
See application file for complete search history.

(56) References Cited

U.S. PATENT DOCUMENTS

| | | | | |
|---|---|---|---|---|
| 6,157,050 A | * | 12/2000 | Fukuoka | ............... H01L 25/167 257/100 |
| 2002/0027280 A1 | * | 3/2002 | Corisis | .................... H01L 23/50 257/692 |
| 2013/0307131 A1 | * | 11/2013 | Uchida | ............. H01L 23/49562 257/676 |
| 2014/0374890 A1 | * | 12/2014 | Yamashita | .......... H01L 23/4952 257/670 |
| 2020/0185308 A1 | * | 6/2020 | Chang | ............... H01L 23/49541 |

\* cited by examiner

*Primary Examiner* — Ermias T Woldegeorgis
(74) *Attorney, Agent, or Firm* — Dawn Jos; Frank D. Cimino

(57) ABSTRACT

A semiconductor package includes a first lead with first and second ends extending in the same direction as one another. At least one second lead has first and second ends and is partially surrounded by the first lead. A die pad is provided and a die is connected to the die pad. Wires electrically connect the die to the first lead and the at least one second lead. An insulating layer extends over the leads, the die pad, and the die such that the first end of the at least one second lead is exposed from the semiconductor package and the second end of the first lead is encapsulated entirely within the insulating layer.

8 Claims, 6 Drawing Sheets

LEADS FOR SEMICONDUCTOR PACKAGE

SUMMARY

In one example, a semiconductor package includes a first lead with first and second ends extending in the same direction as one another. At least one second lead has first and second ends and is partially surrounded by the first lead. A die pad is provided and a die is connected to the die pad. Wires electrically connect the die to the first lead and the at least one second lead. An insulating layer extends over the leads, the die pad, and the die such that the first end of the at least one second lead is exposed from the semiconductor package and the second end of the first lead is encapsulated entirely within the insulating layer.

In another example, a semiconductor package includes a first lead having first and second ends extending in the same direction as one another. At least one second lead each has first and second ends and is partially surrounded by the first lead. A first die pad is provided and a first die is connected to the first die pad and electrically connected to the first and second leads. The first die is configured to transmit an isolation voltage at a first level. A third lead has first and second ends extending in the same direction as one another. At least one fourth lead each has first and second ends and is partially surrounded by the third lead. A second die pad is provided and a second die is connected to the second die pad and electrically connected to the third and fourth leads. The second die is configured to transmit power at a second level greater than the first level. An insulating layer extends over the leads, the die pads, and the dies such that the first ends of the second lead and the fourth lead are exposed and the second ends of the first lead and the third lead are encapsulated entirely within the insulating layer.

Other objects and advantages and a fuller understanding of the invention will be had from the following detailed description and the accompanying drawings.

DETAILED DESCRIPTION

Figure 1:
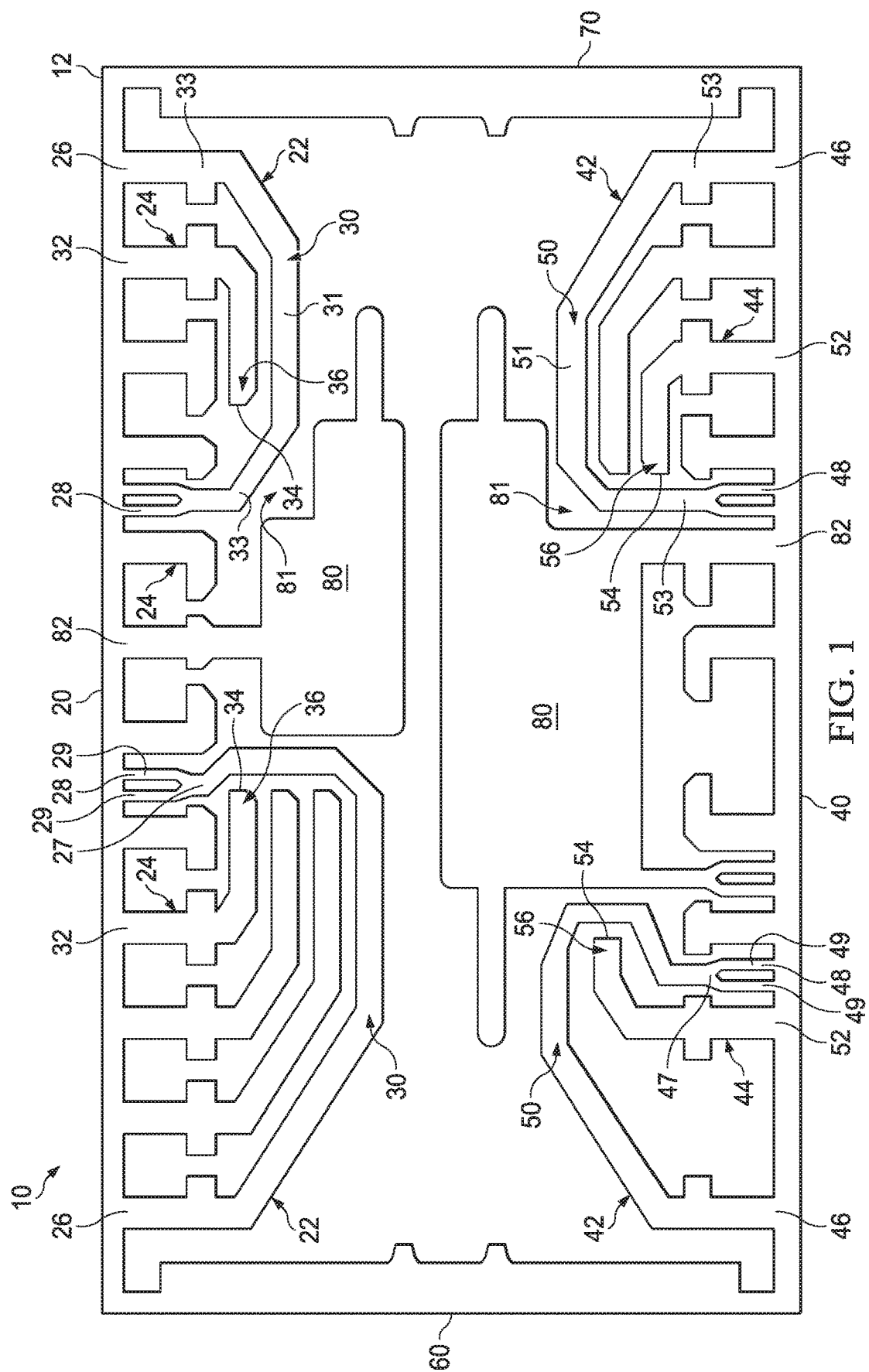
FIG. 1 is a top view of an example lead frame for forming a semiconductor package.

FIG. 1 illustrates an example lead frame 10 used to form a semiconductor package. The semiconductor package can be, for example, a chip or die scale package, PCB scale or panel scale package or a wafer-level chip scale package (WLCSP) of integrated circuits. Consequently, the semiconductor package can be on the millimeter size scale.

The lead frame 10 has a planar, generally rectangular shape and includes a dam-bar 12 having first and second edges 20, 40 extending parallel to one another. Third and fourth edges 60, 70 extend parallel to one another and between the first and second edges 20, 40. Collectively, the edges 20, 40, 60, 70 form the perimeter of the dam-bar. The lead frame 10 is formed from a conductive material, such as copper or a copper alloy. The lead frame 10 can be etched or stamped.

Leads 22, 24, 42, 44 extend from the first edge 20 and the second edge 40. As shown, groups of leads 22, 24 are associated with one another along the first edge 20. Groups of leads 42, 44 are associated with one another along the second edge 40. More specifically, at least one first lead 22 extends from a first end 26 connected to the first edge 20 to a second end 28 also connected to the first edge 20. The first end 26 is positioned in a corner of the lead frame, e.g., adjacent the intersection between the edges 20, 60. The first and second ends 26, 28 of the first lead 22 extend generally in the same direction as one another, e.g., towards the first edge 20.

As shown, portions of the first and second ends 26, 28 extend parallel to one another and, thus, the first lead 22 is substantially U-shaped. To this end, the first lead 22 defines a base 31 and a pair of spaced-apart legs 33 extending from the base. The base 31 can be forked (as shown) or curved (not shown).

The second end 28 of the first lead 22 can have a reduced thickness and/or width relative the dam bar 12 and/or the remainder of the first lead at the interface with the first edge 20. In one example, the second end 28 is U-shaped. More specifically, the second end 28 includes a base 27 and a pair of spaced-apart legs 29 extending from the base to the first edge 20. The base 27 can be forked (as shown) or curved (not shown). The first lead 22 and first edge 20 cooperate to form a closed loop 30. As shown, a pair of first leads 22 is connected to the first edge 20 to form a pair of closed loops 30, with the first ends 26 of the first leads being positioned in opposite corners of the lead frame 10.

One or more second leads 24 extend from the first edge 20 generally towards the geometric center of the lead frame 10. Each second lead 24 has a first end 32 connected to the first edge 20 and a second end 34 spaced from the first edge 20. Each second end 34 terminates at a tip 36.

The first and second leads 22, 24 are positioned along the first edge 20 such that each closed loop 30 encircles at least one second lead. As shown, each closed loop 30 encircles multiple second leads 24. Additional second leads 24 can be positioned between the closed loops 30 and therefore be located outside the loops.

At least one third lead 42 extends from a first end 46 connected to the second edge 40 to a second end 48 also connected to the second edge 40. The first end 46 is positioned in a corner of the lead frame 10, e.g., adjacent the intersection between the edges 40, 60. The first and second ends 46, 48 of the third lead 42 extend generally in the same direction as one another, e.g., towards the first edge 20. As shown, portions of the first and second ends 46, 48 extend parallel to one another and, thus, the third lead 42 is substantially U-shaped. To this end, the third lead 42 defines a base 51 and a pair of spaced-apart legs 53 extending from the base. The base 51 can be forked (as shown) or curved (not shown). That said, the first ends 26, 46 of the first and second leads 22, 24 can extend in the same direction, e.g., parallel, to one another.

The second end 48 of the third lead 42 can have a reduced thickness and/or width relative to the dam bar 12 and/or the remainder of the third lead at the interface with the second edge 40. In one example, the second end 48 is U-shaped. More specifically, the second end 48 includes a base 47 and a pair of spaced-apart legs 49 extending from the base to the second edge 40. The base 47 can be forked (as shown) or curved (not shown). The third lead 42 and second edge 40 cooperate to form a closed loop 50. As shown, a pair of third leads 42 is connected to the second edge 40 to form a pair of closed loops 50, with the first ends 46 of the third leads being positioned in opposite corners of the lead frame 10.

One or more fourth leads 44 extend from the second edge 40 generally towards the geometric center of the lead frame 10. Each fourth lead 44 has a first end 52 connected to the second edge 40 and a second end 54 spaced from the second edge 40. Each second end 54 terminates at a tip 36.

The third and fourth leads 42, 44 are positioned along the second edge 40 such that each closed loop 50 encircles at least one fourth lead. As shown, each closed loop 50 encircles multiple fourth leads 44. Additional fourth leads 44 can be positioned between the closed loops 50 and therefore be located outside the loops.

One or more die pads 80 are connected to the dam-bar 12 and can be positioned between the loops 30, 50 closer to the center of the lead frame 10 than the leads 22, 24, 42, 44. The die pads 80 can have a generally rectangular shape and include a notch 81 for accommodating the leads 22, 42. One or more support bars 82 connect each die pad 80 to the dam-bar 12. As shown, the closed loops 30 are positioned on opposite sides of the die pad 80 connected to the first edge 20. The closed loops 50 are positioned on opposite sides of the die pad 80 connected to the second edge 40.

Figure 2A:
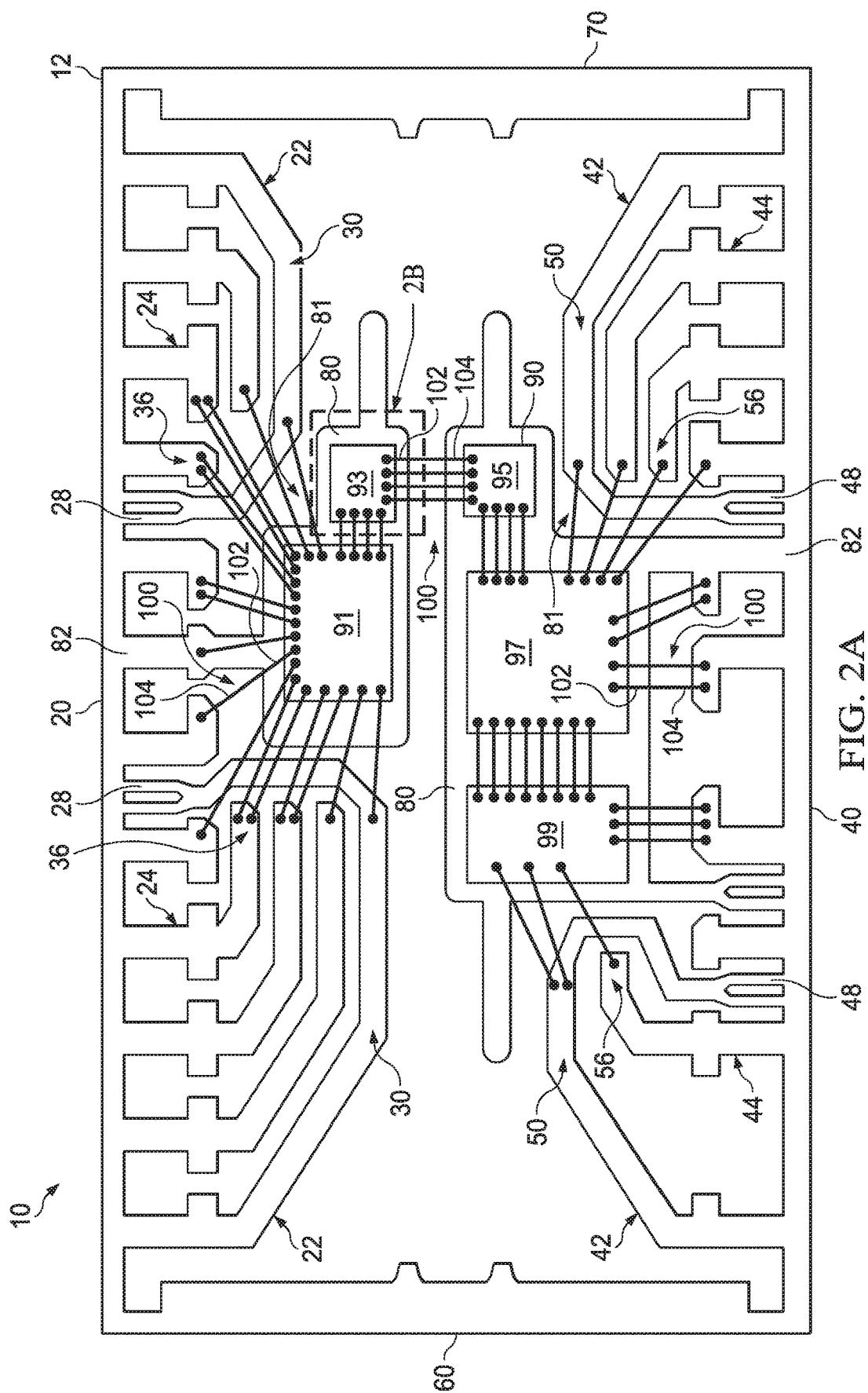
FIG. 2A is a schematic illustration of dies secured to pads on the lead frame of FIG. 1.
Figure 2B:
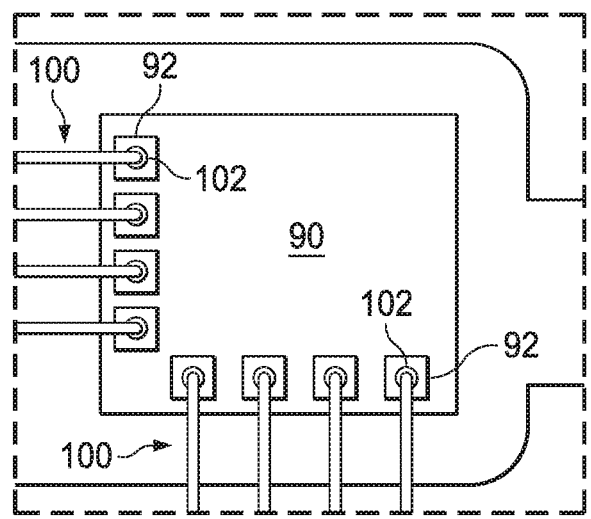
FIG. 2B is an enlarged view of a portion of FIG. 2A.

Referring to FIGS. 2A-2B, at least one die 91-99 is attached to each die pad 80 via adhesive or the like. The dies 91, 93 are located adjacent the leads 22, 24 and nearer the first edge 20. The dies 95, 97, 99 are located adjacent the leads 42, 44 and nearer the second edge 40. Integrated circuits (not shown) are fabricated or otherwise provided within each die 91-99. The integrated circuits are electrically connected to bonding pads 92 exposed through a side of the die 91-99 (the top side as shown). The bonding pads 92 can have any position relative to the top or outer surface of the die 91-99, e.g., recessed, co-planar or extending through. Regardless, the bonding pads 92 can be arranged in a grid or array spaced from one another about the die 91-99. Depending on the size(s) of the die 91-99, dozens, thousands or tens of thousands of bonding pads 92 can be provided on the die.

Wires 100 electrically connect the dies 91-99 to one another and/or electrically connect the dies to the leads 22, 24, 42, 44. Each wire 100 extends from a first end 102 connected to the bonding pad 92 to a second end 104 connected to another die or to one of the leads 22, 24, 42, 44. In one example, the second ends 104 can be connected to the tips 36, 56 of the second and fourth leads 24, 44. The wires 100 can be formed from an electrically conductive material, such as gold or aluminum.

In another example, the dies 93, 95 can be replaced with series capacitors such that the dies 91 and 97, 99 are isolated from one another, e.g., the die 91 is provided power at one voltage and the dies 97, 99 are provided operating signals at another voltage. For instance, the die 91 and wires 100 associated with the first and second leads 22, 24 can form a high voltage side of the device. The dies 97, 99 and wires 100 associated with the third and fourth leads 42, 44 can form a low voltage side of the device.

More specifically, the capacitors 93, 95 can be configured to provide a first voltage isolation, e.g., up to about 5-6 kV, between input and output ends of the device. The dies 97, 99 can collectively act as a gate driver in the device and can be configured to transmit a second voltage different from the first voltage, e.g., up to about 180-600 V. With that said, wires 100 connecting the capacitors 93, 95 can be provided (as shown) or omitted (not shown).

Figure 3A:
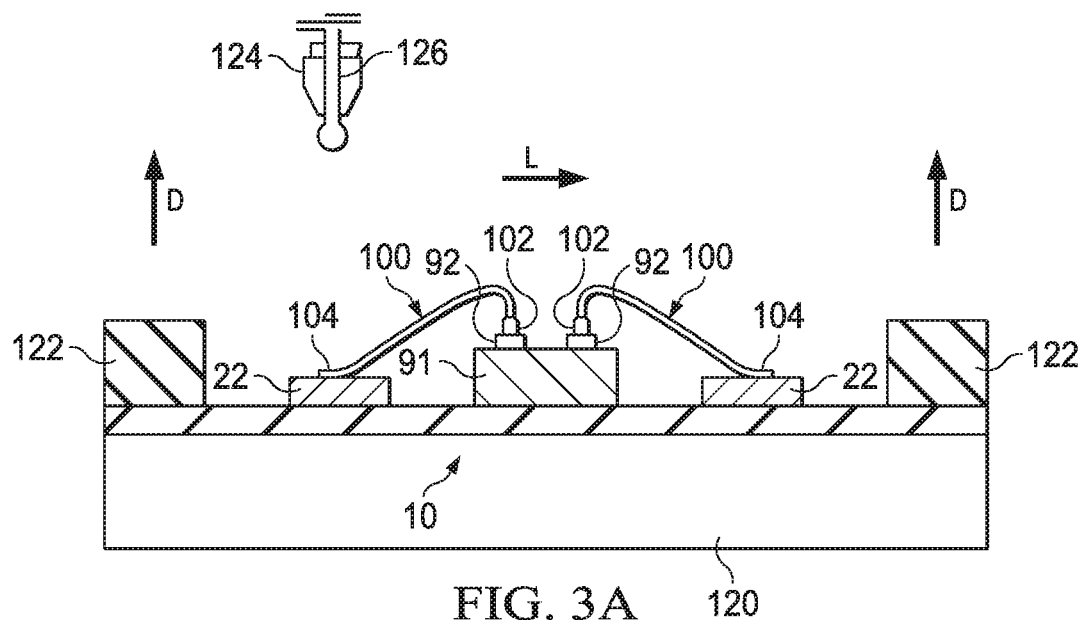
FIG. 3A is a schematic illustration of a process of electrically connecting wires to the die pads and lead frame.

To connect the wires 100 to the bonding pads 92, a capillary 124 (FIG. 3A) supplied with a continuous feed of material 126 forming the wires is positioned over the lead frame 10, which is held in place by clamps 122. The capillary 124 is moved up and down and laterally (indicated by the arrow L) across the lead frame 10. At the same time, the capillary 124 selectively dispenses discrete amounts of the material 126 first onto the bonding pads 92 to form the ends 102 of the wires 100 and then onto one of the leads 22, 24, 42, 44 to form the ends 104. Ball bonds can be used to electrically connect the ends 102 and/or 104 of the wires 100 to the bonding pads 92. Wedge or stitch bonds can be used to electrically connect the ends 104 of the wires 100 to the leads 22, 24, 42, 44. Once all the wires 100 in place the clamps 122 are moved away from the lead frame 10 in the direction D to free the lead frame.

Figure 3B:
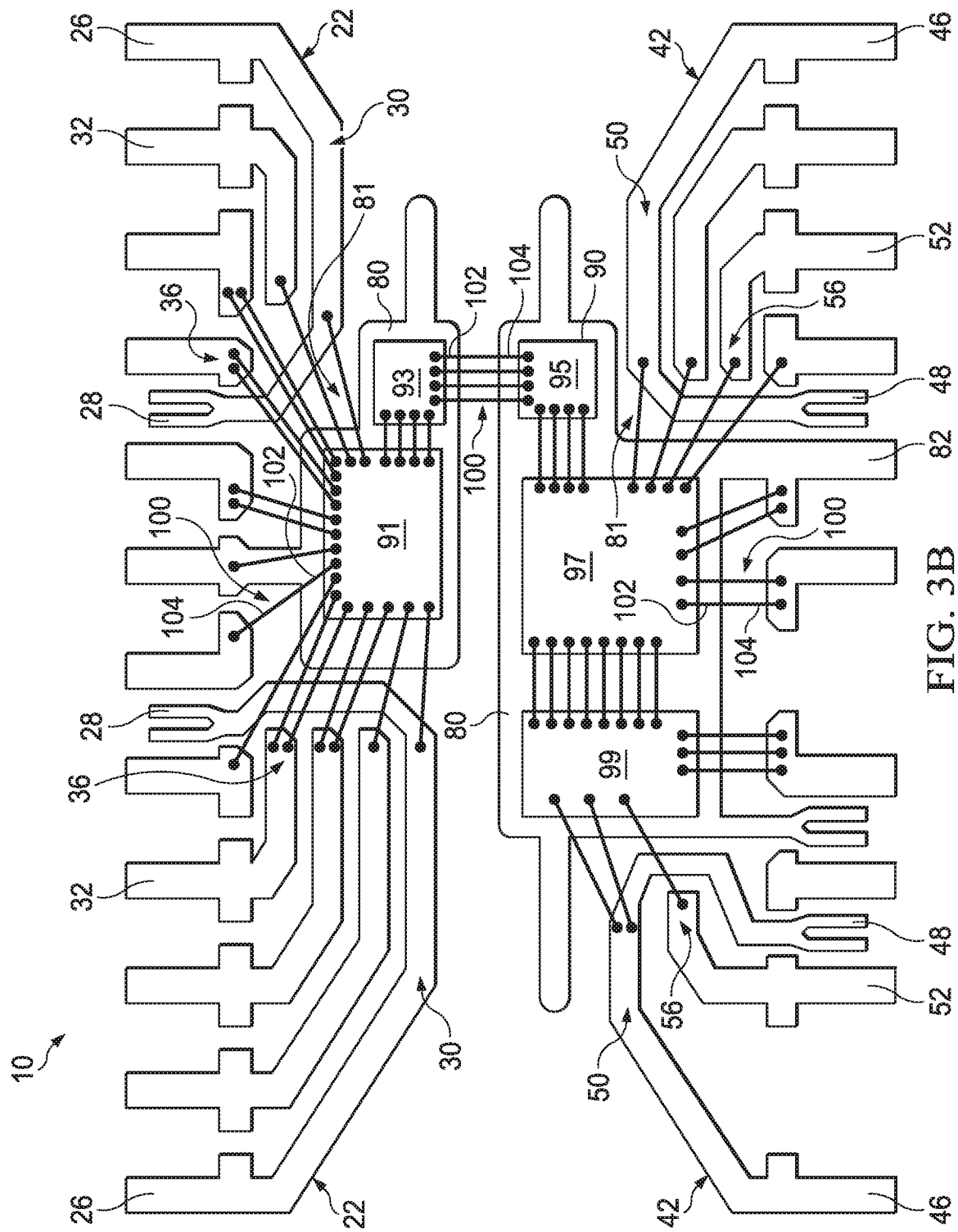
FIG. 3B is a top view of the lead frame with the wires connected thereto.

The dam-bar 12 is then removed from the lead frame 10 as shown in FIG. 3B. More specifically, the edges 20, 40, 60, 70 are removed such that the ends 26, 32, 46, 52 of the leads 22, 24, 42, 44 define the outermost portions of the lead frame 10. In one example, the dam-bar 12 is removed from the leads 22, 24, 42, 44 by cutting. The reduced thickness and/or profile of the second ends 28, 48 of the first and third leads 22, 42 facilitates separating the first and third leads from the dam-bar 12. As a result, existing cutting devices and methods for separating dam-bars from lead frames do not need to be modified.

That said, an amount of the second ends 28, 48 of the first and third leads 22, 42 is removed sufficient to separate the second ends 28, 48 from the dam-bar 12 but keep the first and third leads extending partially around the second and fourth leads 24, 44, respectively. As shown, the first lead 22 extends around several second leads 24 on three sides when separated from the dam-bar 12 and therefore partially surrounds the second leads. The separated first lead 22 is substantially U-shaped, with the first and second ends 26, 28 extending generally in the same direction on opposite sides of the second leads 24.

Similarly, the third lead 42 extends around several fourth leads 44 on three sides when separated from the dam-bar 12 and therefore partially surrounds the fourth leads. The separated third lead 42 is substantially U-shaped, with the first and second ends 46, 48 extending generally in the same direction on opposite sides of the fourth leads 44. The separated first and second ends 26, 32, 46, 52 can extend parallel to one another.

Figure 4:
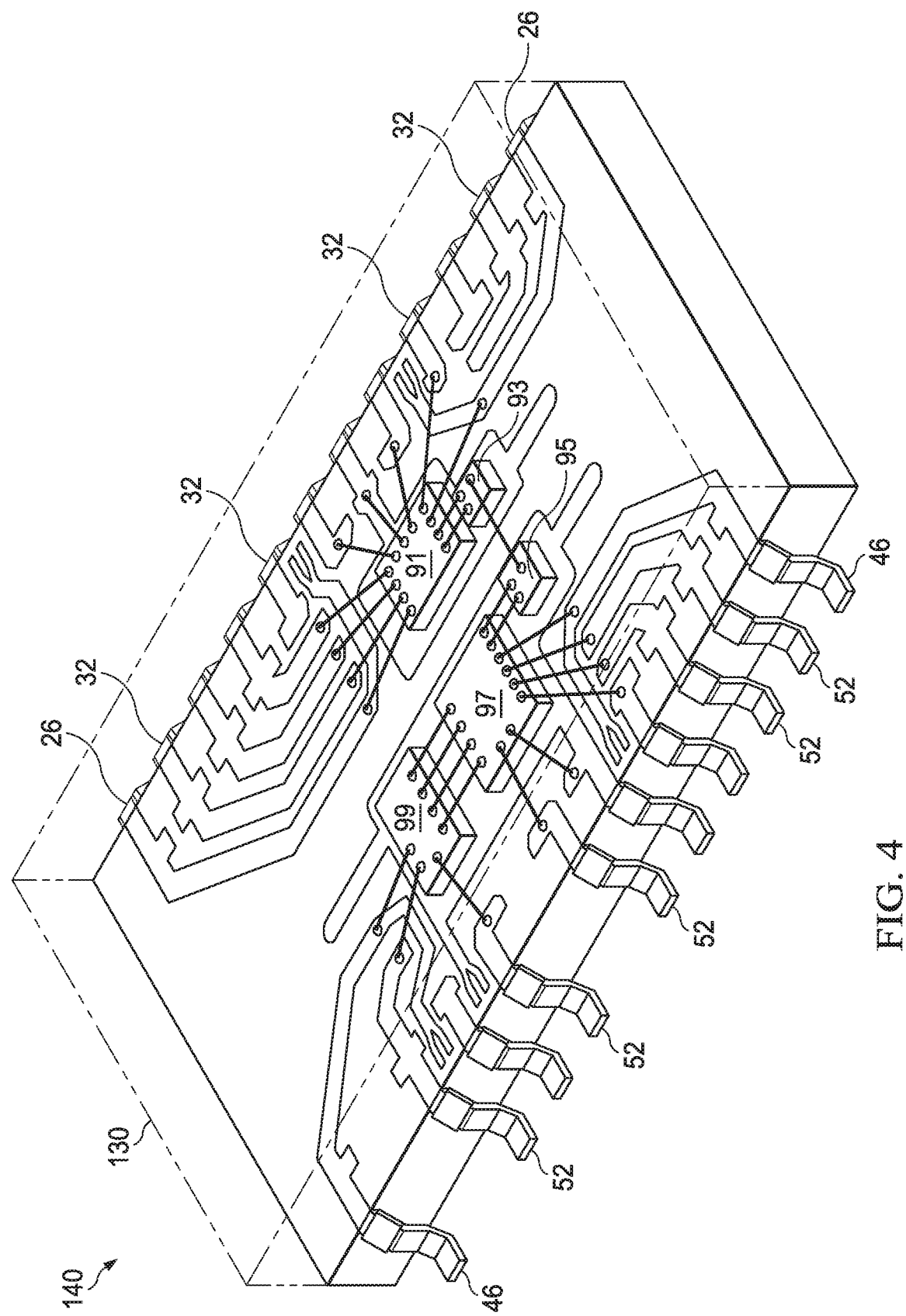
FIG. 4 is a perspective view of a semiconductor package formed from the lead frame and dies.

As shown in FIG. 4, a layer 130 of insulating material such as mold compound is then provided over the lead frame 10, dies 91-99, and wires 100 to encapsulate or encase the dies while exposing portions of the leads 22, 24, 42, 44. The layer 130 is formed from an electrically insulating material, such as polyimide. In one example, the layer 130 is overmolded around the lead frame 10, dies 91-99, and wires 100 such that the first ends 26, 32, 46, 52 of the leads 22, 24, 42, 44 are exposed through the layer 130. The second ends 28, 34, 48, 54, however, are completely enclosed/encased within the layer 130. Consequently, the locations where the ends 28, 34, 48, 54 of the leads 22, 24, 42, 44 connect to the wires 100 are encased in the layer 130 and thereby protected from moisture, physical contact, etc.

With the dam-bar 12 removed, the first ends 26, 32, 46, 52 of the leads 22, 24, 42, 44 are bent or formed relative to the remainder of the leads such that the ends are not co-planar with the remainder of the leads. In one example, the ends 26, 32, 46, 52 are moved to a first plane that is parallel to and beneath (as shown) a second plane in which the remainder of the leads 22, 24, 42, 44 (and die pads 80) reside. The first and second planes can also be perpendicular to one another (not shown). In any case, the first ends 26, 32, 46, 52 form pins for mechanically and electrically connecting the package 140 to a printed circuit board (not shown).

Figure 5:
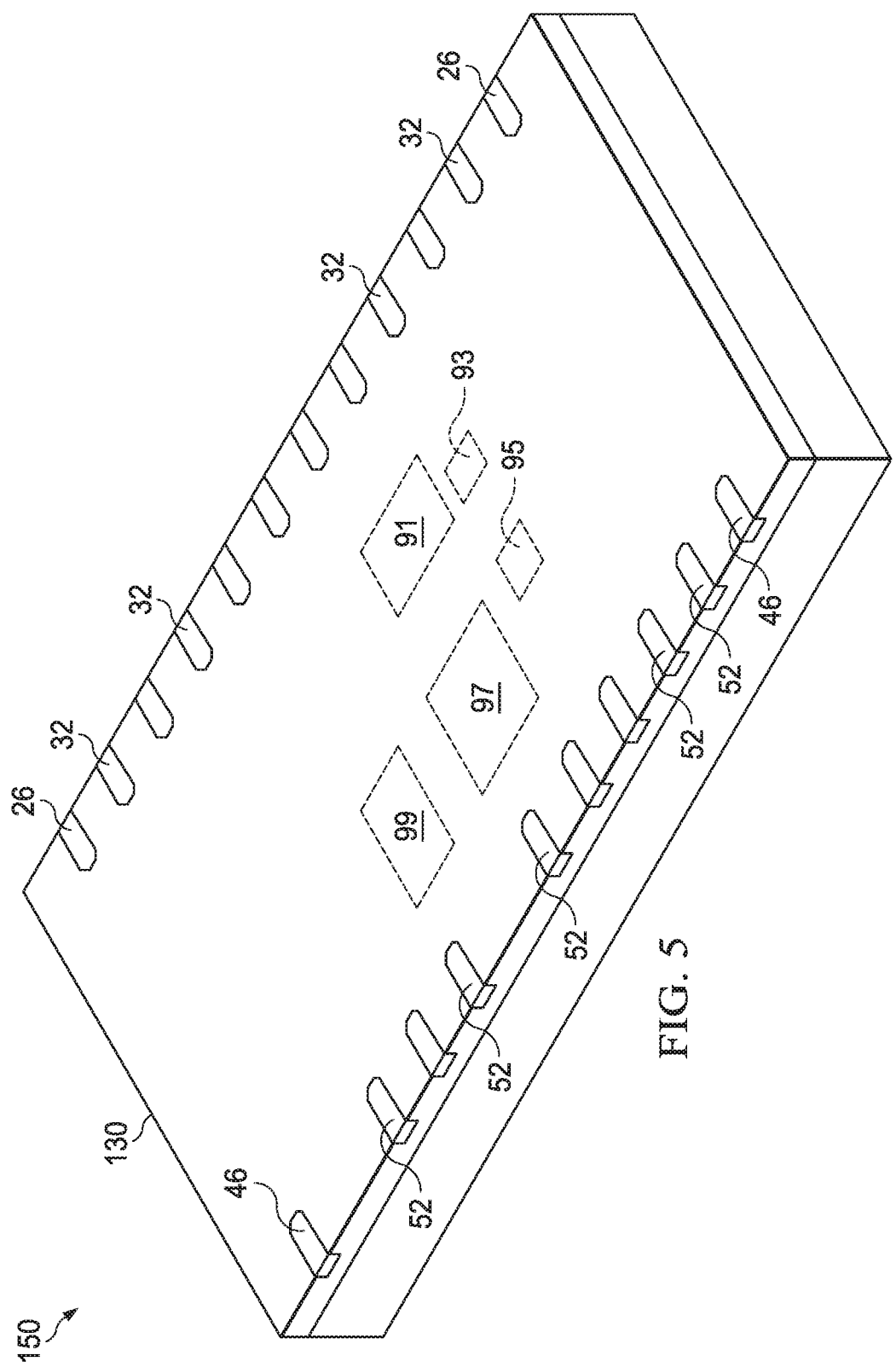
FIG. 5 is a perspective view of another semiconductor package formed from the lead frame and dies.

It another configuration shown in FIG. 5, the package 150 is configured as a quad flat no-leads (QFN) package. In such a construction, the first ends 26, 32, 46, 52 are not bent but instead remain in the same plane as one another and the die pad(s) 80. The layer 130 is provided over the leads 22, 24, 42, 44 such that the bottom of the first ends 26, 32, 46, 52 is exposed through the layer. The die attach pads (not shown) associated with each die 91-99 can also be exposed through the layer 130. The layer 130 and the bottom of the first ends 26, 32, 46, 52 can co-planar. A ball grid array (not shown) can be used to attach the package 150 to a printed circuit board via the exposed first ends 26, 32, 46, 52.

The lead frame and leads shown and described herein are advantageous in that it reduces/minimizes the thermal strain induced in the leads during the wire bonding process. More specifically, during the wire bonding process the leads can experience thermal stresses that are highly concentrated at the corners of the lead frame. The leads originating from the corners tend to be the longest and extend around the leads closer to the lead frame center while still extending close enough to the associated die pad to make the wire connection therebetween.

In some known lead frames, all the leads have one end connected to the dam-bar and another end which is free/unattached and terminates in proximity to the die to which it will be attached via the wire. In other words, the leads do not extend around or cooperate with other lead frame structure to encircle or loop around other leads. That said, the leads all act as cantilevered beams in response to stress, e.g., heat and compression, and therefore experience bending moments. The leads originating from the corners—being the longest—experience the largest bending moment.

With this in mind, when the clamp used to hold the lead frame in place during the heating/wire bonding process is opened to release the lead frame from the heat block, the sudden stress release can induce strain and therefore displacement of the free ends of the leads. As the length of the lead increases, so does the degree of displacement of the second ends. An increased displacement can possibly lead to damage of the ball necks, which is undesirable. While the clamp can be released at a slowed rate displacement of the free ends of the corner leads can be unavoidable.

The closed loop leads on the lead frame described herein, however, reduce thermal strain on the leads by rerouting the strain back to the dam-bar. In other words, by connecting both ends of the corner leads to the dam-bar, the corner leads are better supported on the lead frame and the free ends that would otherwise be susceptible to deformation under thermal stress are eliminated.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A semiconductor package comprising:
   a first lead having first and second ends extending in the same direction as one another;
   at least one second lead each having first and second ends and being partially surrounded by the first lead;
   a first die pad;
   a first die connected to the first die pad and electrically connected to the first and second leads, the first die configured to transmit an isolation voltage at a first level;
   a third lead having first and second ends extending in the same direction as one another;
   at least one fourth lead each having first and second ends and being partially surrounded by the third lead;
   a second die pad;
   a second die connected to the second die pad and electrically connected to the third and fourth leads, the second die configured to transmit power at a second level greater than the first level; and
   an insulating layer extending over the leads, the die pads, and the dies such that the first ends of the second lead and the fourth lead are exposed and the second end of the first lead and the third lead are encapsulated entirely within the insulating layer.

2. The semiconductor package recited in claim 1, wherein the first lead is substantially U-shaped from a top view of the semiconductor package.

3. The semiconductor package recited in claim 1, wherein the first and second ends of the first lead extend parallel to one another.

4. The semiconductor package recited in claim 1, wherein the first lead extends to opposite sides of the at least one second lead.

5. The semiconductor package recited in claim 1, wherein the third lead is substantially U-shaped.

6. The semiconductor package recited in claim 1, wherein the first and second ends of the third lead extend parallel to one another.

7. The semiconductor package recited in claim 1, wherein the third lead extends to opposite sides of the at least one fourth lead.

8. A quad flat no-leads package comprising the semiconductor package recited in claim 1.

\* \* \* \* \*